(12) United States Patent
Rao et al.

(10) Patent No.: US 8,122,422 B2
(45) Date of Patent: Feb. 21, 2012

(54) ESTABLISHING BENCHMARKS FOR ANALYZING BENEFITS ASSOCIATED WITH VOLTAGE SCALING, ANALYZING THE BENEFITS AND AN APPARATUS THEREFOR

(75) Inventors: Vishwas M. Rao, Breinigsville, PA (US); James C. Parker, Zionsville, PA (US); Stephen A. Masnica, Macungie, PA (US); Robert C. Sibert, Bethlehem, PA (US)

(73) Assignee: LSI Corporation, Milpitas, CA (US)

( * ) Notice: Subject to any disclaimer, the term of this patent is extended or adjusted under 35 U.S.C. 154(b) by 388 days.

(21) Appl. No.: 12/510,082

(22) Filed: Jul. 27, 2009

(65) Prior Publication Data
US 2011/0023004 A1    Jan. 27, 2011

(51) Int. Cl.
*G06F 17/50* (2006.01)
(52) U.S. Cl. .......................... 716/136; 716/111
(58) Field of Classification Search .................. None
See application file for complete search history.

(56) References Cited

U.S. PATENT DOCUMENTS

| 7,714,610 B2 * | 5/2010 | He | 326/41 |
| 2011/0138347 A1 * | 6/2011 | Tetelbaum | 716/133 |

OTHER PUBLICATIONS

Mathur et al., "Power Reduction Techniques and Flows at RTL and System Level," 2009 22nd Int'l Conference on VLSI Design, Tutorial T3, pp. 28-29.*
Parker, et al.; "A Method for Designing Integrated Circuits Employing a Partitioned Hierarchical Design Flow and an Apparatus Employing the Method"; U.S. Appl. No. 12/510,104, filed Jul. 27, 2009.
Parker, et al.; "Methods for Designing Integrated Circuits Employing Context-Sensitive and Progressive Rules and an Apparatus Employing One of the Methods"; U.S. Appl. No. 12/510,122, filed Jul. 27, 2009.
Parker, et al.; "Methods for Designing Integrated Circuits Employing Voltage Scaling and Integrated Circuits Designed Thereby"; U.S. Appl. No. 12/364,918, filed Feb. 3, 2009.
Jamann, et al.; "A Systematic Normalized Metric for Analyzing and Comparing Optimization Techniques for Integrated Circuits Employing Voltage Scaling and Integrated Circuits Designed Thereby"; U.S. Appl. No. 12/365,010, filed Feb. 3, 2009.
Jamann, et al.; "A Systematic Benchmarking System and Method for Standardized Data Creation, Analysis and Comparison of Semiconductor Technology Node Characteristics"; U.S. Appl. No. 12/365,084, filed Feb. 3, 2009.
Snowdon, et al.; "Power Management and Dynamic Voltage Scaling: Myths and Facts"; National ICT Australia and School of Computer Science and Engineering, University of NSW, Sydney 2052, Australia, dated Sep. 16, 2005, 7 pages.
Kandemir, et al.; "Energy-Conscious Compilation Based on Voltage Scaling"; LCTES02-SCOPES02, Jun. 19-21, 2002, 10 pages.

* cited by examiner

*Primary Examiner* — Leigh Garbowski

(57) ABSTRACT

Methods for establishing benchmarks and for analyzing benefits associated with voltage scaling are provided. In one embodiment, the method for establishing benchmarks includes: (1) synthesizing a netlist from a RTL of a functional IC design; (2) implementing a layout of an IC from the netlist, wherein the synthesizing and the implementing are performed at designated voltages and frequencies over a voltage and a frequency range, the voltage range including a voltage scaling range and a voltage associated with a designated implementation of the IC; (3) obtaining measurements of at least one voltage scaling metric associated with the IC at each of the designated voltages and frequencies; and (4) normalizing measurements associated with the voltage scaling range to measurements associated with the designated implementation employing a processor to obtain normalized benchmarks for analyzing optimization of the IC associated with voltage scaling. EDA tools may be used for synthesizing, implementing and obtaining.

20 Claims, 9 Drawing Sheets

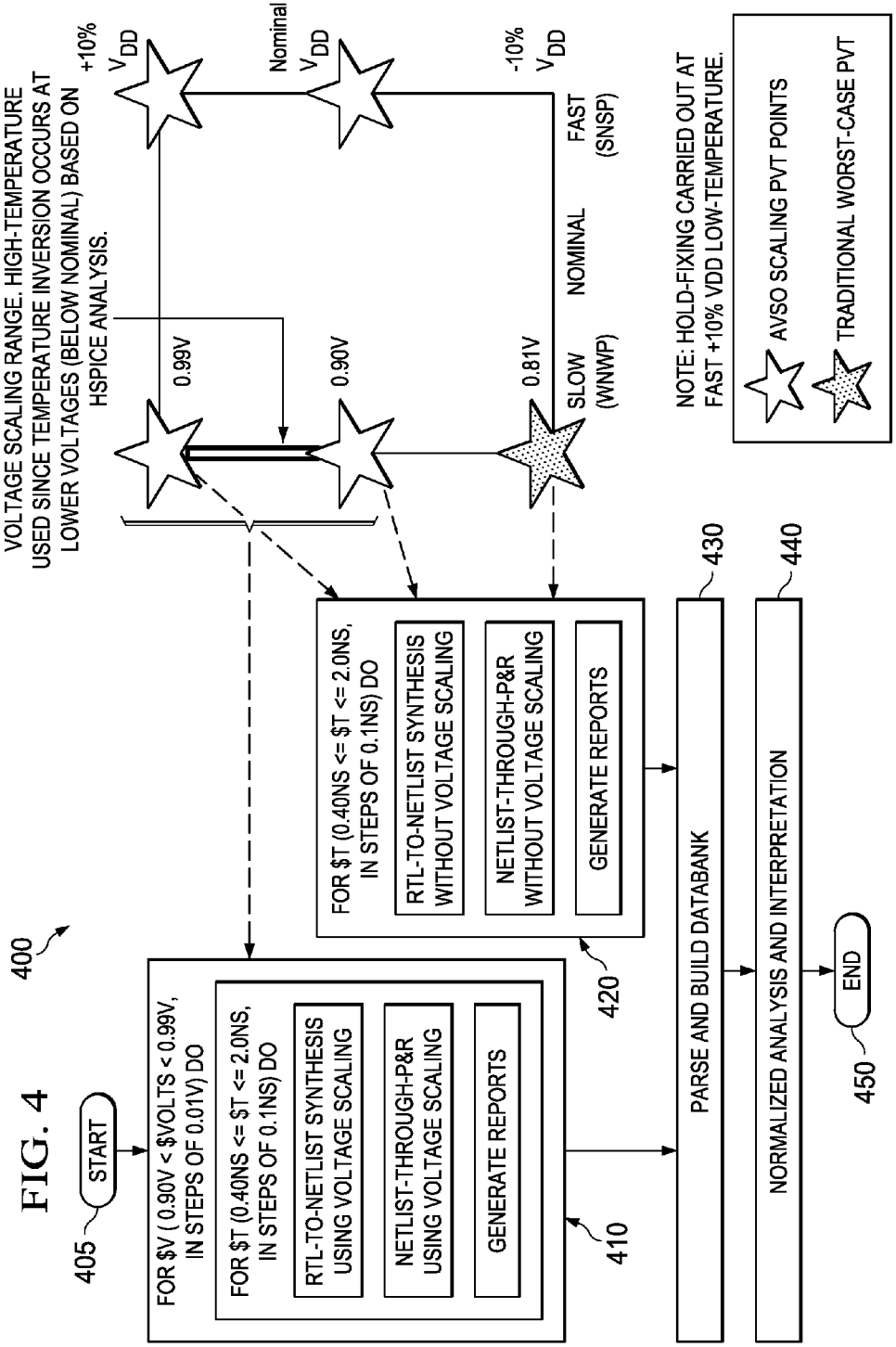

ESTABLISHING BENCHMARKS FOR ANALYZING BENEFITS ASSOCIATED WITH VOLTAGE SCALING, ANALYZING THE BENEFITS AND AN APPARATUS THEREFOR

CROSS REFERENCE TO RELATED APPLICATIONS

This application is related to the following U.S. patent applications, which are commonly assigned herewith and incorporated herein by reference in their entirety:

Ser. No. 12/510,104, filed by Parker, et al., on even date herewith and entitled, "A Method For Designing Integrated Circuits Employing A Partitioned Hierarchical Design Flow And An Apparatus Employing The Method;" and Ser. No. 12/510,122, filed by Parker, et al., on even date herewith and entitled, "Methods For Designing Integrated Circuits Employing Context Sensitive And Progressive Rules And An Apparatus Employing One Of The Methods."

This application is also related to the following non-provisional applications commonly assigned with the invention and incorporated herein by reference: U.S. patent application Ser. No. 12/364,918 filed by Parker, et al., on Feb. 3, 2009, entitled "Methods for Designing Integrated Circuits Employing Voltage Scaling and Integrated Circuits Designed Thereby," U.S. patent application Ser. No. 12/365,084 filed by Jamann, et al., on Feb. 3, 2009, entitled "A Systematic Benchmarking System and Method for Standardized Data Creation, Analysis and Comparison of Semiconductor Technology Node Characteristics" and U.S. patent application Ser. No. 12/365,010 filed by Jamann, et al., on Feb. 3, 2009, entitled "A Systematic, Normalized Metric for Analyzing and Comparing Optimization Techniques for Integrated Circuits Employing Voltage Scaling and Integrated Circuits Designed Thereby."

TECHNICAL FIELD

This application is directed, in general, to integrated circuits (ICs) and, more specifically, to voltage scaling techniques employed with ICs.

BACKGROUND

Conserving resources, including energy, has become a preeminent objective in today's world. Manufacturers of ICs are sensitive to the need to improve the energy efficiency of their products. Those skilled in the pertinent art are aware that various measures may be taken in an electronic circuit to reduce its power consumption. One measure is to use cells (i.e., logic elements including devices, e.g., transistors) that leak less current when turned off. Another measure is to use a lower voltage to drive the cells. Unfortunately, using lower leakage current cells or lower drive voltages almost always reduces the speed at which signals propagate through the circuit. Consequently, the circuit may not operate as fast as needed or desired.

Thus a fundamental trade-off exists among speed and power consumption. Further considerations involve speed, power consumption, area and yield. These force the circuit designer to employ EDA tools, particularly timing signoff, to strike a delicate balance. Tempering the designer's zeal are the above-described process and environmental variations to which every production circuit is subject. These variations increase the degree to which the designer must ensure that production circuits work under real-world operating conditions and therefore the complexity of timing signoff.

Further complicating the designer's task is the difficulty of determining the consequences of design choices, particularly when they involve different technology nodes. In other words, a designer may not have the information needed to make optimal decisions regarding the technology node or nodes to employ to fabricate a particular IC design.

Voltage scaling is a technique whereby the drive voltage to a particular IC is modulated to one or more particular values such that the IC can function properly (e.g., the circuit operates as fast as needed or desired). Voltage scaling is particularly suited to compensate for process variations. Static voltage scaling may be performed at the factory (e.g., during calibration) or before the IC begins normal operation (e.g., during power-up initialization). In contrast, adaptive voltage scaling and optimization (AVSO) is performed continually while the IC is in normal operation and particularly effective at compensating for temperature variations and device aging as well as process variations. ICs can have one or more domains, each having its own voltage regulator. Drive voltage can therefore be modulated separately in each domain, allowing compensation for on-chip-variations (OCV) to be carried out as well.

Voltage scaling (including AVSO), therefore, can be used to compensate for process and temperature variations and aging in an IC that has been designed by a conventional method. Additionally, voltage scaling can be used to change the fundamental theory under which an IC operates. Accordingly, the method by which an IC is designed may be transformed to take full advantage of the benefits of voltage scaling. Thus, voltage scaling can be used when designing ICs such that their performance, area, power consumption, yield or any combination of these may be improved beyond the limits of current design methods. As such, it would be beneficial in the art to be able to accurately determine the benefits provided by voltage scaling techniques including, for example, AVSO.

SUMMARY

One aspect provides a method of establishing benchmarks to analyze benefits associated with voltage scaling. In one embodiment, the method of establishing benchmarks includes: (1) synthesizing a netlist from a register transfer level of a functional integrated circuit design employing a first EDA tool, (2) implementing a layout of an integrated circuit from the netlist employing a second EDA tool, wherein the synthesizing and the implementing are performed at designated voltages and frequencies over a voltage range and a frequency range, the voltage range including a voltage scaling range and a voltage associated with a designated implementation of the integrated circuit, (3) obtaining measurements of at least one voltage scaling metric associated with the integrated circuit at each of the designated voltages and frequencies employing a third EDA tool and (4) normalizing measurements associated with the voltage scaling range to measurements associated with the designated implementation employing a processor to obtain normalized benchmarks for analyzing optimization of the integrated circuit associated with voltage scaling.

In another aspect, a method of analyzing benefits to an IC associated with voltage scaling techniques is provided. In one embodiment, the method of analyzing benefits, includes: (1) obtaining measurements of voltage scaling metrics over a voltage range and a frequency range across an register transfer level through place and route portion of a design flow for the integrated circuit employing EDA tools, (2) normalizing the voltage scaling metric measurements over a designated implementation for the integrated circuit to obtain normalized benchmarks and (3) assessing, by employing the normalized benchmarks, a metric profile of the integrated circuit offered by voltage scaling techniques, wherein the normalizing and the assessing are performed by a processor.

In yet another aspect, an apparatus is provided. In one embodiment, the apparatus includes: (1) a metric determiner configured to obtain measurements over a voltage range and a frequency range of at least one voltage scaling metric associated with an integrated circuit across a register transfer level through a place and route portion of a design flow for the integrated circuit, (2) a metric normalizer configured to normalize the measurements and (3) a metric assessor configured to analyze the measurements and generate ranges for benefits associated with employing voltage scaling with the integrated circuit.

BRIEF DESCRIPTION

Reference is now made to the following descriptions taken in conjunction with the accompanying drawings, in which:

FIG. 4 illustrates an example of a flow diagram of a method, carried out according to the principles of the disclosure, used to analyze the benefits of voltage scaling techniques employable with an IC.

DETAILED DESCRIPTION

Figure 1:
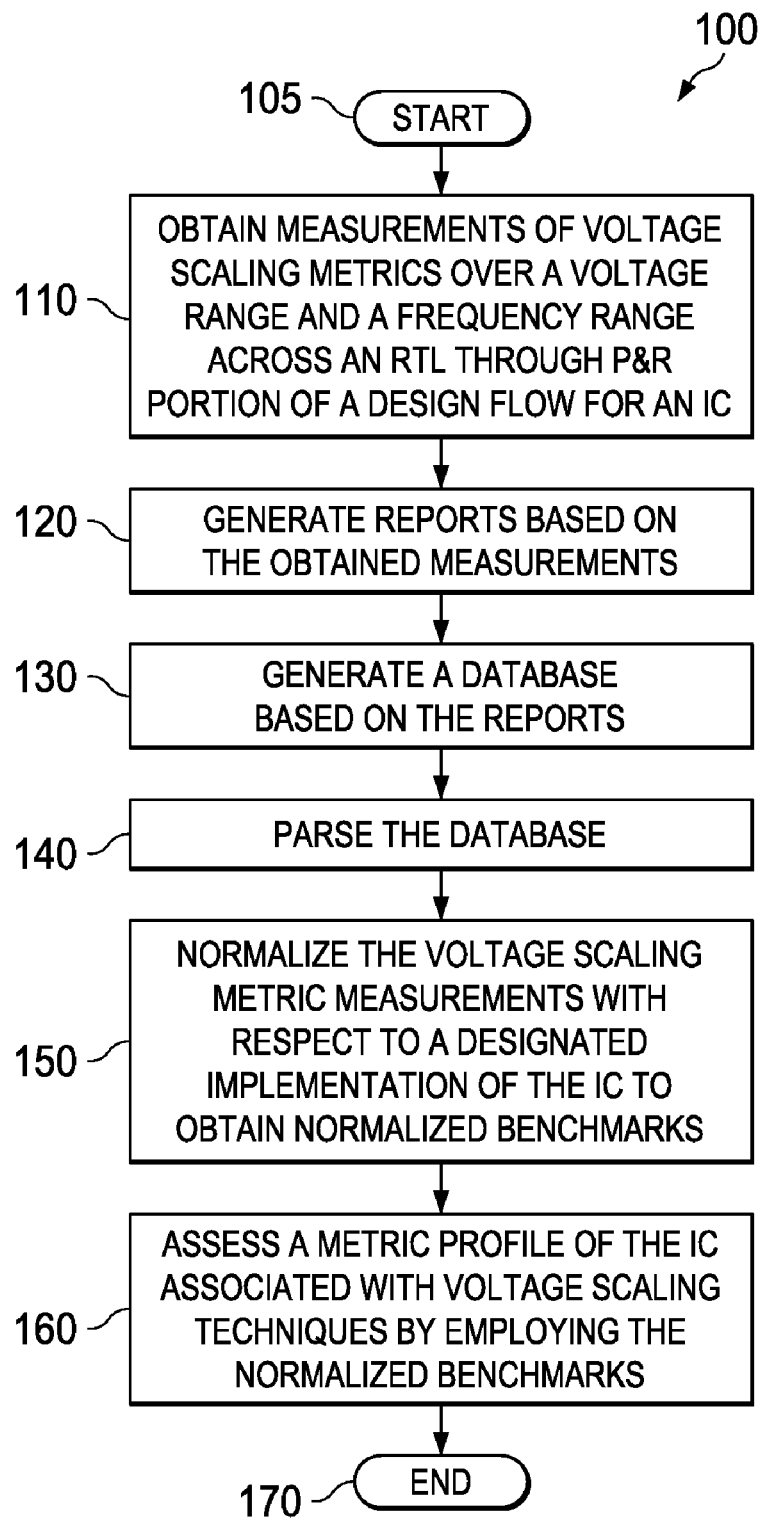
FIG. 1 illustrates a flow diagram of an embodiment of a method, carried out according to the principles of the present disclosure, of analyzing benefits to an IC associated with employing voltage scaling techniques.

Accurately measuring the true performance power benefits provided by voltage scaling techniques in general and AVSO in specific would be beneficial. The methodology proposed in this disclosure provides a comprehensive approach to analyzing the impact of optimization on an IC by measuring the optimization component (which is a key part of AVSO) for the register transfer level (RTL) through to the place and route (P&R) process of an IC design flow. The measurements can then be used to carry out an accurate assessment of the performance, area, utilization and power (leakage+dynamic) profile offered by voltage scaling and potentially exploitable by techniques like AVSO. The benefits of voltage scaling may then be consistently compared across technologies and also within the same technology for various implementations at different voltages and frequencies of operation. A given IC or IC design can be profiled with reference to a technology to determine exactly how the technology parameters (PVT) can be leveraged to obtain the best benefit for cost in performance, power and area. Thus, the disclosure provides a method for analyzing the benefits of employing voltage scaling techniques and of establishing benchmarks for the analyzing by modeling an IC through the RTL to P&R of the design flow at different voltages and frequencies.

Models of the IC are constructed under multiple sets of assumptions regarding expected variations, called "PVT corners." Process-voltage-temperature (PVT) PVT corners are based on assumptions regarding variations in device operation from one IC to another, drive voltage and operating temperature. Resistance-capacitance (R, C, or RC) PVT corners are based on assumptions regarding variations in one or both of interconnect resistance and capacitance from one IC to another.

Conventional timing signoff identifies setup and hold violations in a "slow" PVT corner (in which process variations are assumed to yield relatively slow-switching devices, and drive voltage and operating temperature are such that device switching speeds are their slowest) and a "worst" RC corner (in which process variations are assumed to yield interconnects having relatively high resistance and capacitance).

Conventional timing signoff also identifies hold violations in a "fast" PVT corner (in which process variations are assumed to yield relatively fast-switching devices, and drive voltage and operating temperature are such that device switching speeds are their fastest) and a "best" RC corner (in which process variations are assumed to yield interconnects having relatively low resistance and capacitance). Conventional signoff timing also takes OCV, which can be used to account for PVT variations and for process variations occurring over the area of a given IC, into account using statistical methods. The fast PVT and best RC corner are sometimes jointly referred to as a fast-fast (FF) or best-case fast (BCF) corner, and the slow PVT and worst RC corner are sometimes jointly referred to as a slow-slow (SS) or worst-case slow (WCS) corner.

Disclosed herein, comprehensively benchmarking normalized power and performance across the PVT range of an IC using voltage scaling is provided. Instead of ad-hoc point measurements, the disclosure provides an approach that accounts for changes in the optimization benefit as voltage is gradually scaled; including an estimation of the optimization component provided through AVSO. The method for benchmarking can also be used, for example, for Dynamic Voltage Scaling (DVS) and Dynamic Voltage Frequency Scaling (DVFS). The methodology disclosed provides a comprehensive RTL-to-GDSII optimization across frequencies, coupled with normalized computation to determine an objective measurement.

FIG. 1 illustrates a flow diagram of an embodiment of a method 100 of analyzing benefits to an IC associated with employing voltage scaling techniques. The method 100 may employ various EDA tools and a computer processor to perform the various steps. The computer processor may be used to direct the operation of the EDA tools, communicate information there between and provide an interface between a designer and the various EDA tools. At least part of the method may be implemented as a series of operating instructions stored on a computer readable medium that directs the operation of the processor when initiated thereby. The method 100 begins in a step 105.

In a step 110, measurements of voltage scaling metrics are obtained over a voltage range and a frequency range across an RTL through P&R portion of a design flow for an IC. EDA tools may be employed to obtain the measurements. For example, the Design Compiler-Topographical (DC-T) tool from Synopsys, Inc., of Mountain View, Calif., may be used to synthesize a netlist from a RTL of a functional IC design. The IC compiler (ICC) tool from Synopsys, Inc., may then be used for P&R of active elements of the netlist of the IC. One skilled in the art will understand that other synthesis or implementation tools may be used.

The iterative synthesis and P&R are performed over a frequency range at various steps. For instance, as discussed later with respect to a 40 nm technology node example, a frequency range between 0.4 nanoseconds and 2.0 nanoseconds may be used with a step of 0.1 nanoseconds. Smaller steps, such as 0.05 nanoseconds in the example, may be used around points of inflection.

In addition to the frequency range, the measurements are also taken over the voltage range across the RTL to P&R process. The voltage range can include a voltage scaling range that reflects a range of voltages that may be used if voltage scaling is employed. The voltage scaling range may be based on the technology node of the IC and/or how an organization, such as a manufacturer, wants to leverage the technology. The voltage scaling range may be from a nominal voltage to a nominal voltage plus ten percent. For example, continuing with the 40 nanometer technology node example, a range of 0.9 to 0.99 volts may be used for the voltage scaling range. The voltage range may also include a voltage for a designated implementation of the IC that will be used subsequently for normalization. In one embodiment, the designated implementation occurs at designated worst corner. For example, for performance, the designated worst corner may be at the worst-case-slow-corner (WCSC) and for power the designated worst corner may be at the worst-case-fast-corner (WCFC).

The voltage scaling metrics that are measured at each step may include timing, utilization, area and power. A measure of cell-mix or other metrics may also be used. Commercially available EDA tools may be used to obtain the measurements. For example, PrimeTime PX (PT-PX) also provided from Synopsys, Inc., may be used to perform the power analysis through the RTL to P&R process.

After obtaining the measurements, reports are generated in a step 120 that are based on the obtained measurements. The reports may be generated by the various EDA tools that are used to obtain the measurements. From the reports, a database is generated in a step 130. The database includes the various measurements obtained. In a step 140, the database is parsed. Parsing the database is performed to organize the elements thereof for analysis. Generating the reports, generating the database and parsing the database are all conventional steps associated with databases that one skilled in the art will understand.

Thereafter, the voltage scaling metric measurements are normalized with reference to a designated implementation of the IC in a step 150 to obtain normalized benchmarks. As noted previously, the designated implementation may be at the WCSC for the IC. In the 40 nanometer technology node example, the WCSC may be at 0.81 volts.

The normalized benchmarks are then employed to assess a metric profile of the IC in a step 160. The metric profile may reflect optimization that is possible for the IC due to voltage scaling techniques such as AVSO, AVS, DVS and DVFS. Assessing the metric profile may include identifying zones of operation for using voltage scaling with the IC. Additionally, the assessing may include identifying expected performance gains associated with employing voltage scaling with the IC. In some embodiments, assessing may include identifying a percentage of area reduction for the IC associated with employing a voltage scaling technique. Thereafter, the method 100 ends in a step 170.

Figure 2:
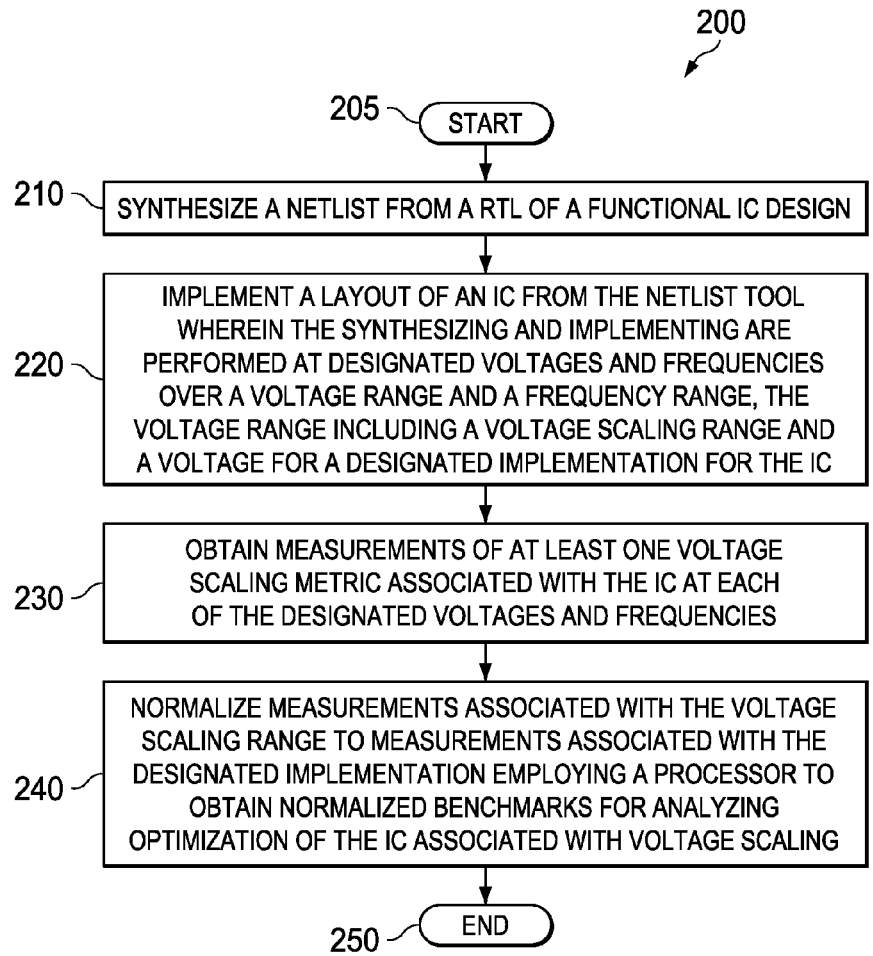
FIG. 2 illustrates a flow diagram of an embodiment of a method of establishing benchmarks for analyzing an IC carried out according to the principles of the present invention.

FIG. 2 illustrates a flow diagram of an embodiment of a method 200 of establishing benchmarks for analyzing an IC. The method 200 may employ various EDA tools and a computer processor to perform the various steps. The computer processor may be used to direct the operation of the EDA tools, communicate information therebetween and provide an interface between a designer and the various EDA tools. At least part of the method may be implemented as a series of operating instructions stored on a computer readable medium that directs the operation of the processor when initiated thereby. The method 200 begins in a step 205.

In a step 210, a netlist is synthesized from a RTL of a functional IC design. To synthesize the netlist, an EDA tool may be used. DC-T or another commercially available EDA synthesizing tool may be used.

In a step 220, a layout of an IC is implemented from the netlist. Implementation of the IC includes placement and routing of active elements of the functional IC design based on the synthesized netlist. Both the synthesizing and the implementation are performed at designated voltages and frequencies over a voltage range and a frequency range. Accordingly, multiple implementations can be developed at different steps over the ranges.

The voltage range may include voltages across a voltage scaling range and a voltage associated with a designated implementation for normalization. The designated implementation for normalization may occur at the traditional WCSC for the IC. The voltage scaling range may be from a nominal voltage of the IC to one hundred and ten percent of the nominal voltage. Additionally, the WCSC may be ninety percent of the nominal voltage. Implementations of the IC over the voltage scaling range are performed at a high temperature according to the PVT corners associated with the functional IC design. As with the synthesizing, a conventional EDA tool may also be employed for implementing the IC design. For example, ICC or another P&R EDA tool may be employed for the implementation process.

Throughout the iterative process of synthesis and implementation, measurements are obtained of at least one voltage scaling metric associated with the IC in a step 230. The measurements are obtained at each of the designated voltages and frequencies (i.e., at each step). An EDA tool or tools may also be employed to obtain the measurements including DC-T, ICC and PT-PX.

In one embodiment, measurements for a plurality of voltage scaling metrics are obtained. The plurality of voltage scaling metrics can be used to provide a profile for offered by voltage scaling techniques and exploitable by, for example, AVSO. The plurality of voltage scaling metrics may include a performance metric, a utilization metric, an area metric and power metrics. The power metrics may includes a leakage power metric or a dynamic power metric.

After obtaining the measurements, the measurements associated with the voltage scaling range are normalized to measurements associated with a designated implementation in a step 240. Normalizing the measurements to a designated implementation provides normalized benchmarks for analyzing optimization of the IC associated with voltage scaling techniques including AVSO. The designated implementation may occur at the WCSC of the IC. Obtaining and normalizing the measurements may be performed by a designated computing device. The method 200 ends in a step 250.

Figure 3:
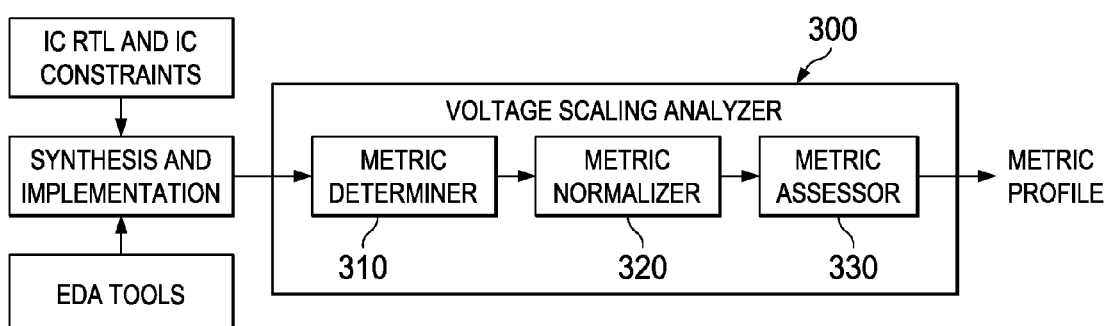
FIG. 3 illustrates a block diagram of one embodiment of a voltage scaling analyzer constructed according to the principles of the present invention.

FIG. 3 illustrates a block diagram of one embodiment of a voltage scaling analyzer 300 constructed according to the principles of the present invention. The voltage scaling analyzer 300 may include the necessary circuitry to perform or direct steps of the methods 100 and 200 previously discussed. In one embodiment, at least part of the voltage scaling analyzer 300 may be embodied as a series of operating instructions stored on a computer-readable medium of a processor that direct the operation of the processor when initiated thereby. Additionally, the voltage scaling analyzer 300 may be a dedicated computing device. The voltage scaling analyzer 300 includes a metric determiner 310, a metric normalizer 320 and a metric assessor 330.

The metric determiner 310 is configured to obtain measurements over a voltage range and a frequency range of at least one voltage scaling metric associated with an IC across an RTL through P&R portion of a design flow for the IC. The metric determiner 310 may obtain the measurements from a synthesized and implemented IC that was developed via EDA tools per IC RTL and IC constraints.

The metric normalizer 320 is configured to normalize the measurements with respect to measurements obtained at a designated implementation. The designated implementation may be from the PVT corners associated with the IC. To normalize the measurements, each of the measurements may be divided by the associated measurement at the designated implementation. Normalization allows determining the percentage deviation from the designated implementation. It can be used to effectively compare all the other implementations.

The metric assessor 330 is configured to analyze the measurements and generate ranges for benefits associated with employing voltage scaling with the IC. The metric assessor 330 may analyze the measurements by identifying zones of operation for using voltage scaling with the IC. Additionally, the metric assessor 330 may analyze the measurement by identifying expected performance gains associated with employing voltage scaling with the IC. Based on the analysis, the metric assessor 330 can provide a metric profile offered by voltage scaling. The metric profile may be provided as a consolidated graph delivered to a user via electronic signals and an interface such as, for example, a display.

FIG. 4 illustrates an example of a flow diagram of a method 400, carried out according to the principles of the disclosure, used to analyze the benefits of voltage scaling techniques employable with an IC. Also illustrated in FIG. 4 is a graph of PVT corners for the IC and the relationship between the steps of the method 400 and points of the PVT corners. The method 400 and the FIGS. 5A to 5E represent an example for obtaining measurements, normalizing measurements and analyzing the measurements of an IC at the 40 nanometer node. The method 400 begins in a step 405.

The method 400 continues in a step 410 by obtaining measurements of voltage scaling metrics over a voltage range and a frequency range across an RTL through P&R portion of a design flow for the IC. As illustrated, the voltage range is from a nominal voltage to +10 percent of the nominal voltage. The range, however, can be determined by a user in advance (e.g., a person or organization can stretch beyond the +/−10% range by building the required models).

In this technology specific example (for the 40 nm technology node), the range is from 0.90 volts to 0.99 volts. A high temperature is used with this voltage scaling range since temperature inversion can occur at lower voltages (i.e., below nominal) based on previous analysis (e.g., from simulations such as by HSpice). The measurements are obtained at each step within the voltage scaling range. In this example, the step is 0.01 volt.

At each voltage step, the measurements are also obtained across a frequency sweep. In this example for the 40 nm technology node, the frequency range is between 0.40 nanoseconds and 2.0 nanoseconds at 0.1 nanosecond steps.

In a step 420, measurement of voltage scaling metrics are also obtained across the RTL through P&R portion of the design flow for the IC without voltage scaling. In this step, the measurements are obtained at particular voltages of the PVT without a voltage sweep. In the illustrated embodiment, the measurements are obtained at the traditional worst-case PVT, the nominal voltage and +10 percent of the nominal voltage. In both steps 410 and 420, reports are generated based on the measurements. The data (i.e., frequencies, voltages and the measurements obtained thereat) from the reports can then be used to build a databank for analysis.

In a step 430, a databank is built and parsed. The databank can be built using the data generated by the reports. The databank may be a typical database that is constructed and parsed to organize the data for further analysis.

Normalized analysis and interpretation of the data is then performed in a step 440. The normalized analysis may include constructing performance, utilization, area and power profiles based on the data that is normalized to the WCSC of the PVT corners. FIG. 5A to FIG. 5E illustrate examples of the analysis performed. The method 400 then ends in a step 450.

Figure 5A:
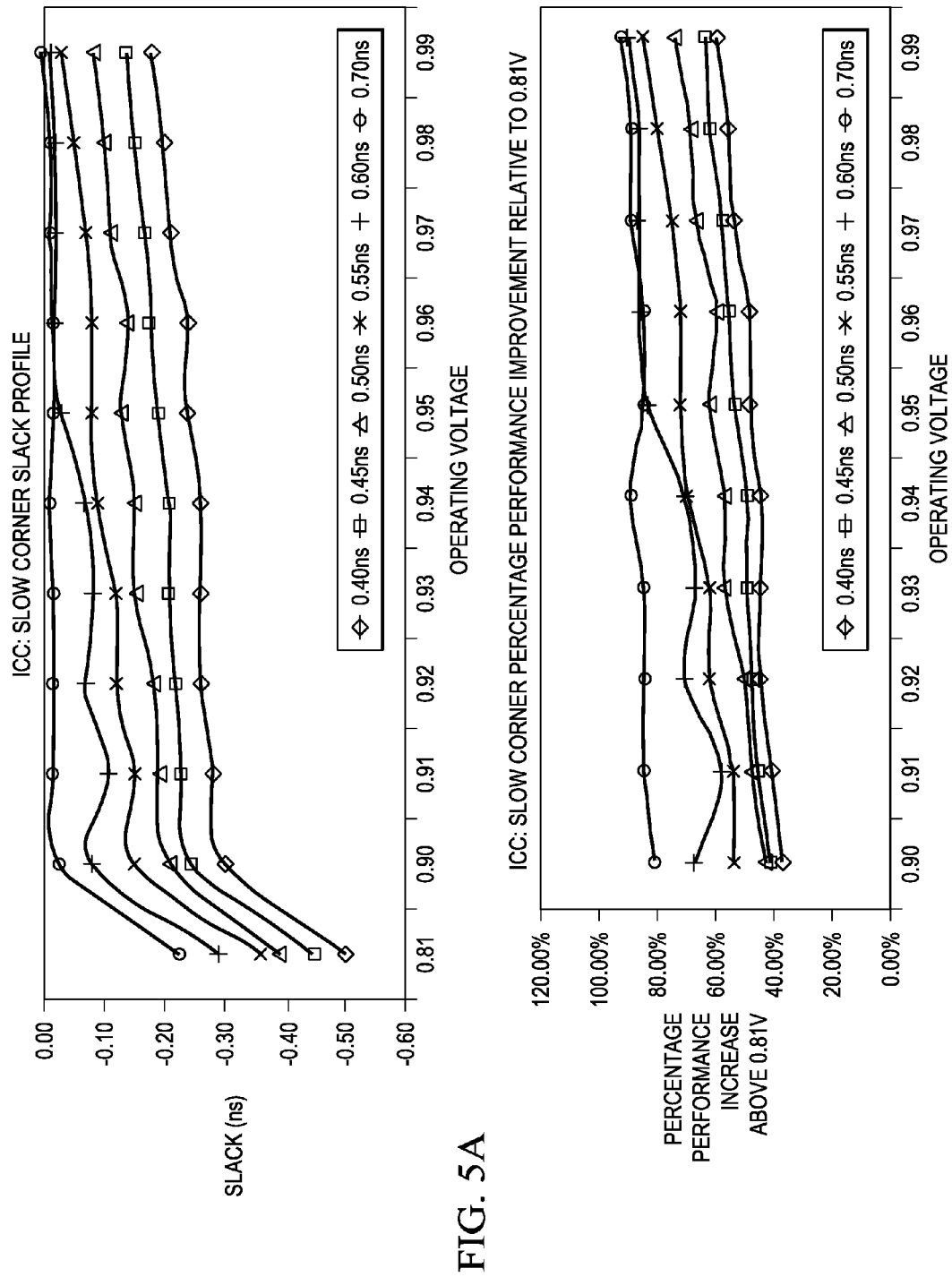
FIGS. 5A to 5E illustrate graphs that represent the normalized measurements and the analysis performed in the example.
Figure 5B:
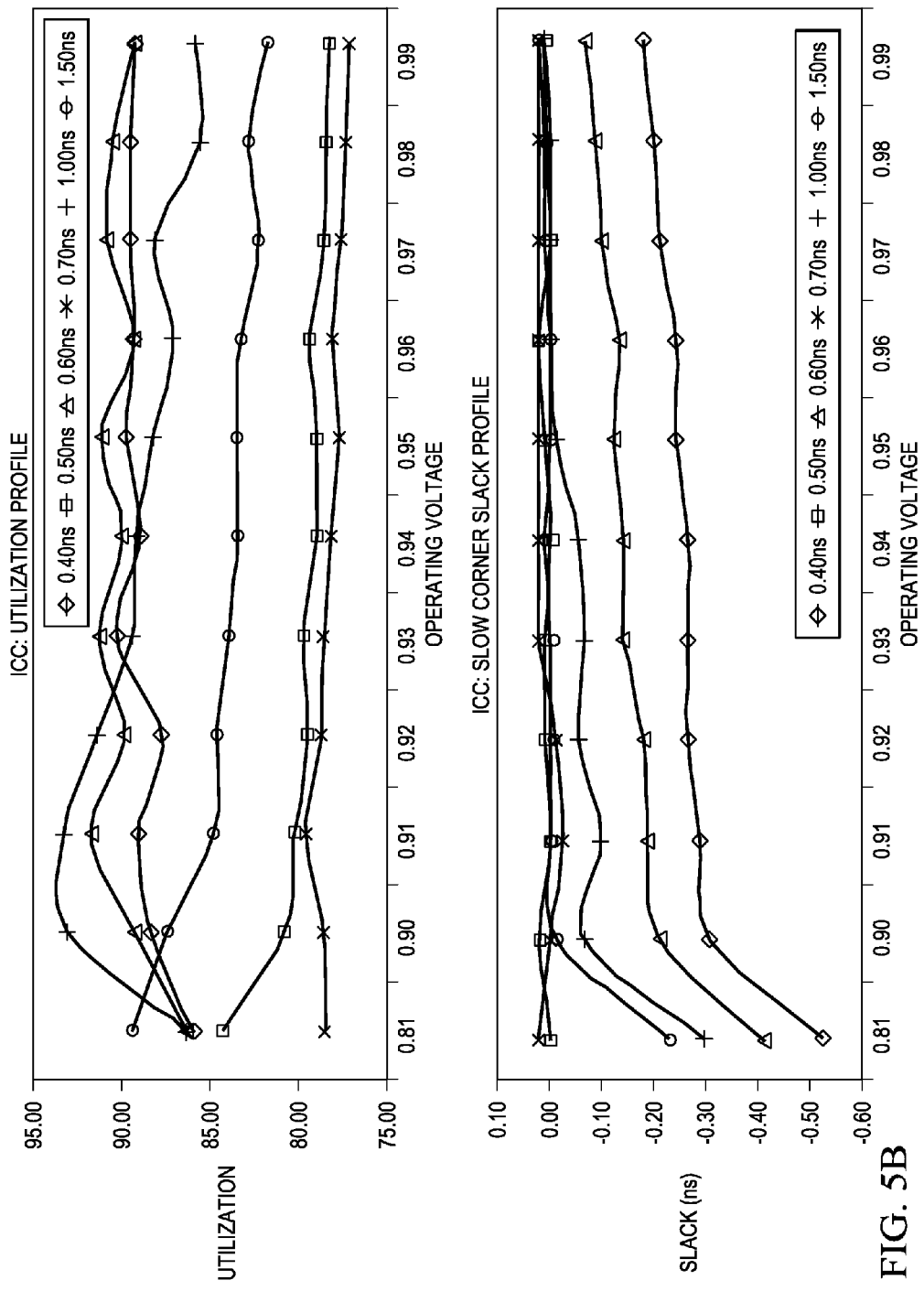

FIGS. 5A to 5E illustrate graphs that represent the normalized measurements and the analysis performed in the example of FIG. 4. The normalized measurements and analysis is for the 40 nanometer technology node and an 0.81 volts WCSC. FIGS. 5A to 5B can be used to make business decisions regarding when to use and when not to use voltage scaling if IC construction.

Figure 5C:
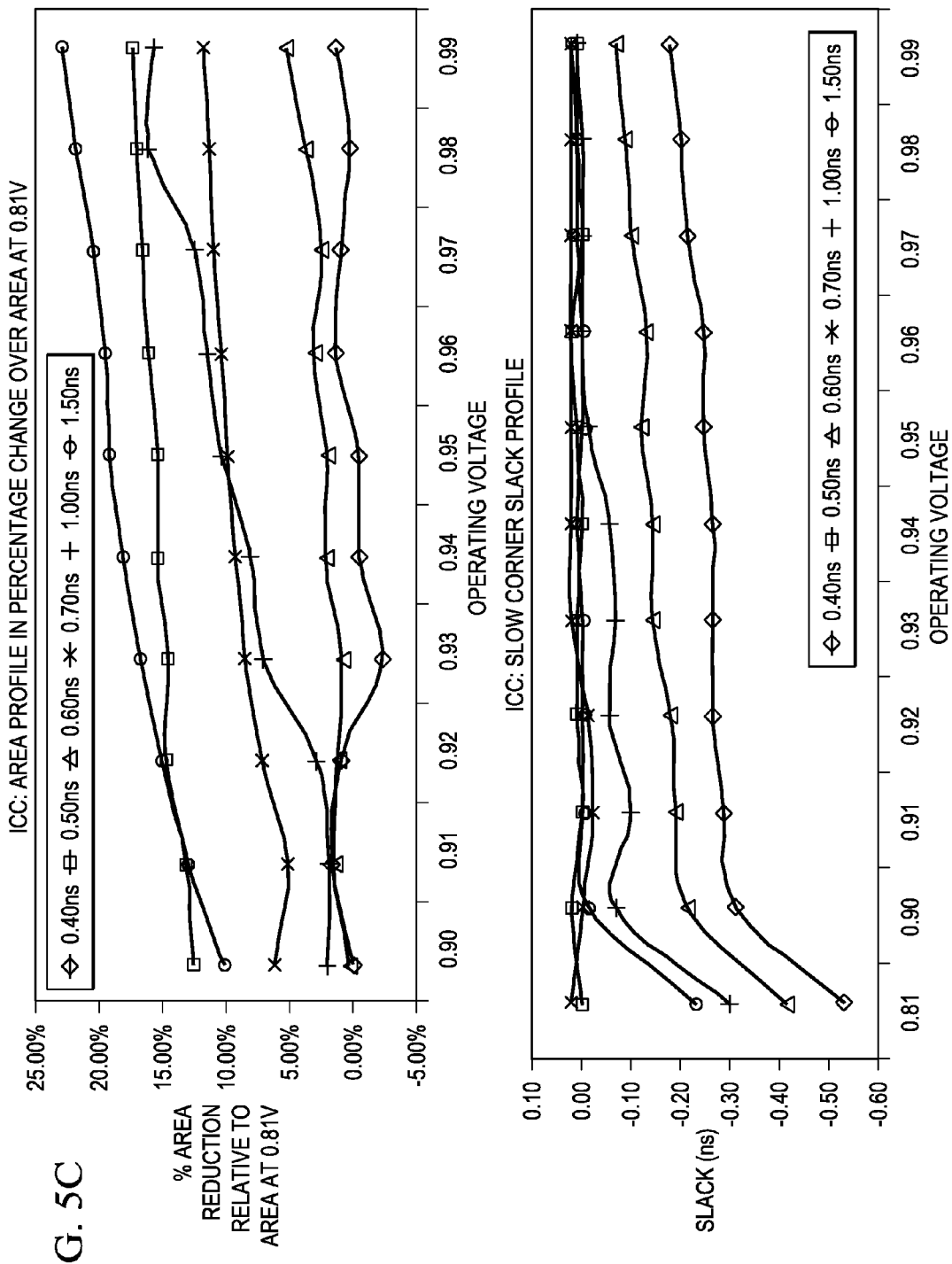
Figures 1, 5D:
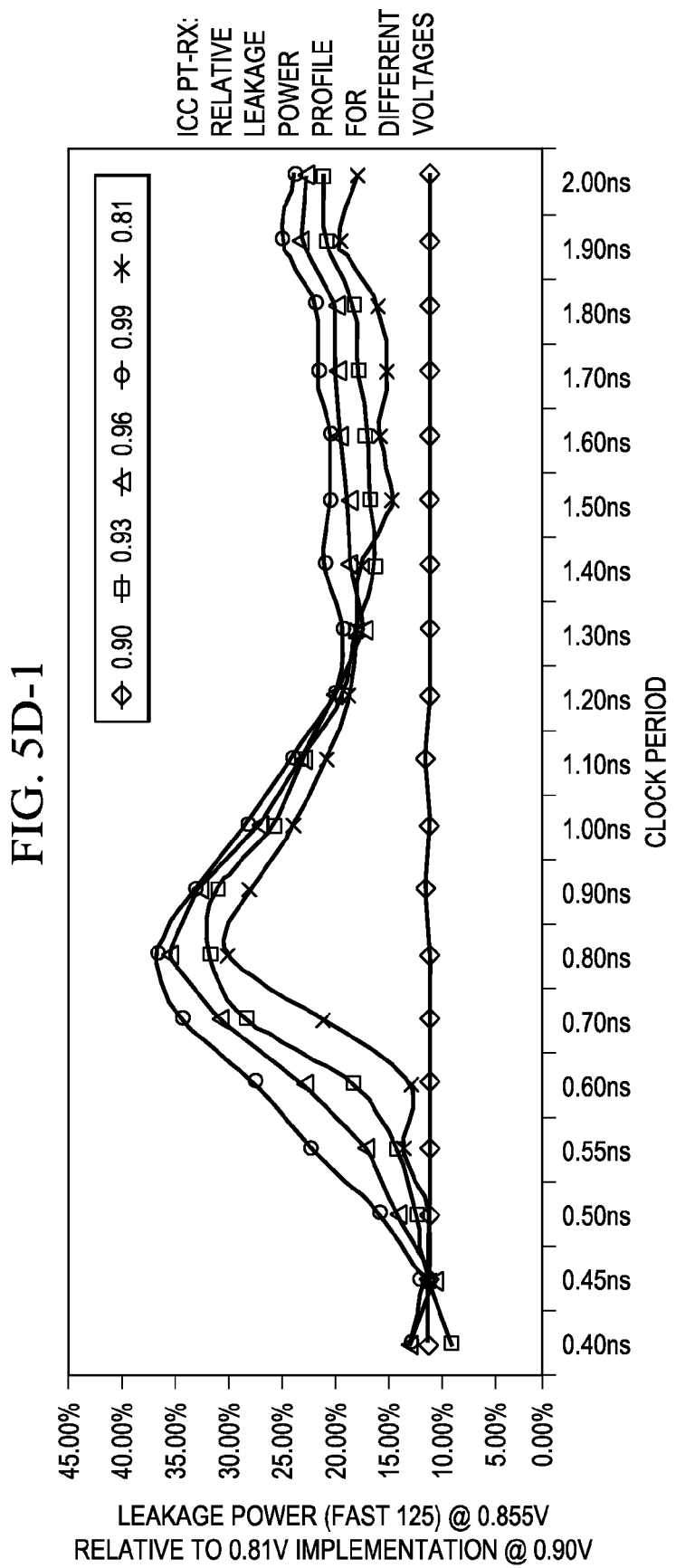
Figures 2, 5D:
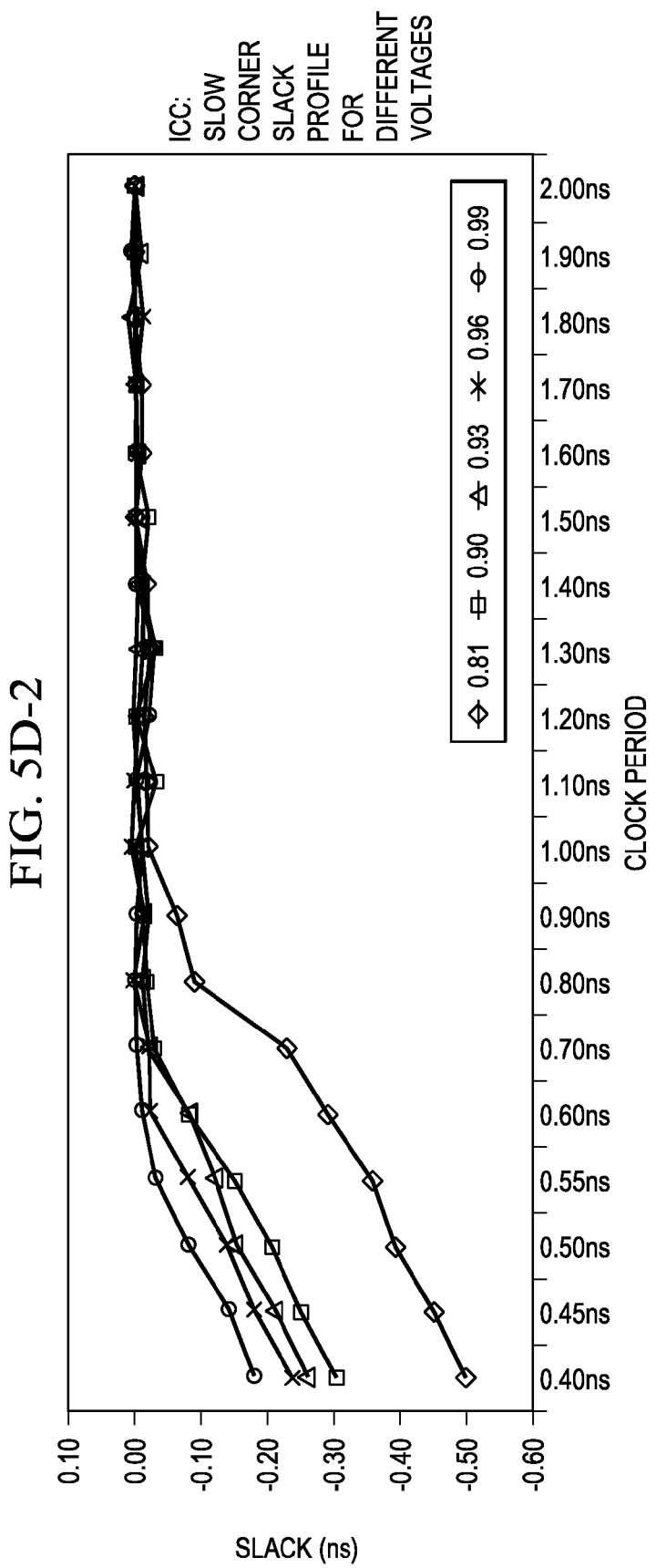
Figure 5E:
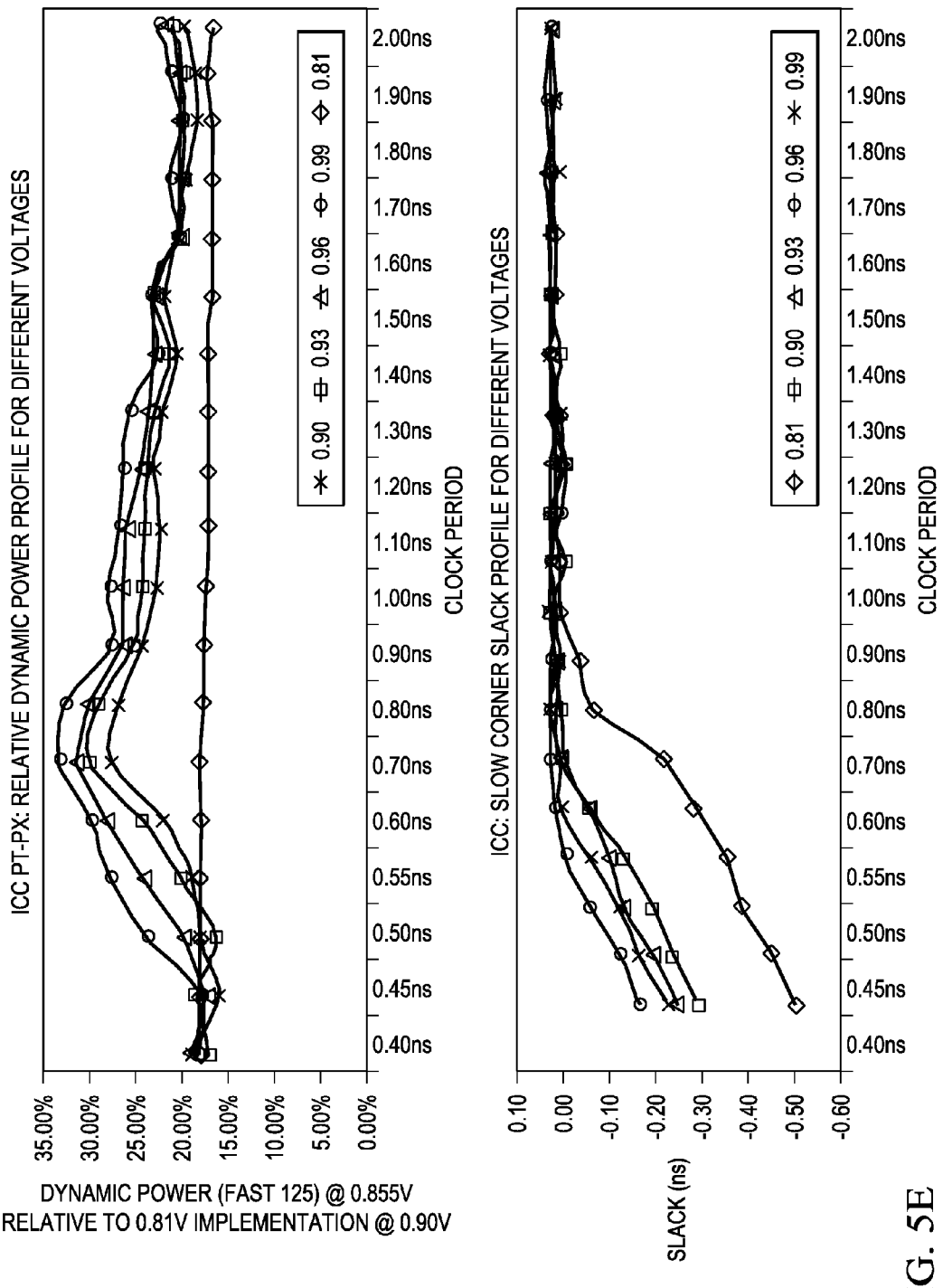

Each of FIGS. 5A to 5E includes two graphs. A first graph represents a slow corner slack profile for an IC over a range of operating voltages. The second graphs of FIGS. 5A to 5E are also over a range of operating voltages. In FIG. 5A, the second graph represents percentage performance improvement at the slow corner when employing a voltage scaling technique. In FIG. 5B, the second graph represents a utilization profile at various operating voltages and clock speeds. In FIG. 5C, the second graph represents the percentage of area reduction relative to the area used for the WCSC. In FIG. 5D, the second graph represents the leakage power at 0.855 volts relative to 0.81 volt implementation at 0.90 volts. In other words, the IC is implemented at the slow LV corner and leakage is measured at the fast HV corner. The second graph is FIG. 5E represents the dynamic power at 0.855 volts relative to a 0.81 volt implementation measure at 0.90 volts.

Those skilled in the art to which this application relates will appreciate that other and further additions, deletions, substitutions and modifications may be made to the described embodiments.

What is claimed is:

1. A method of establishing benchmarks to analyze benefits associated with voltage scaling, comprising:
   synthesizing a netlist from a register transfer level of a functional integrated circuit design employing a first EDA tool;
   implementing a layout of an integrated circuit from said netlist employing a second EDA tool, wherein said synthesizing and said implementing are performed at designated voltages and frequencies over a voltage range and a frequency range, said voltage range including a voltage scaling range and a voltage associated with a designated implementation of said integrated circuit;
   obtaining measurements of at least one voltage scaling metric associated with said integrated circuit at each of said designated voltages and frequencies employing a third EDA tool; and
   normalizing measurements associated with said voltage scaling range to measurements associated with said designated implementation employing a processor to obtain normalized benchmarks for analyzing optimization of said integrated circuit associated with voltage scaling.

2. The method as recited in claim 1 wherein said voltage scaling range is based on a technology node of said integrated circuit.

3. The method as recited in claim 2 wherein said designated implementation is at a designated worst corner from process-voltage-temperature corners associated with said functional integrated circuit design.

4. The method as recited in claim 3 wherein said designated worst corner with respect to performance is a worst-case-slow-corner.

5. The method as recited in claim 1 further comprising obtaining a plurality of voltage scaling metrics.

6. The method as recited in claim 5 wherein said plurality of voltage scaling metrics includes a metric selected from the group consisting of:
a performance metric,
a leakage power metric, and
a dynamic power metric.

7. The method as recited in claim 5 wherein said plurality of voltage scaling metrics includes a metric selected from the group consisting of:
a utilization metric, and
an area metric.

8. The method as recited in claim 1 wherein said implementing includes placement and routing of active elements of said functional integrated circuit design based on said synthesizing.

9. The method as recited in claim 1 wherein a high temperature is used for said voltage scaling range, said high temperature based on process-voltage-temperature corners associated with said functional integrated circuit design.

10. The method as recited in claim 1 wherein said voltage scaling is adaptive voltage scaling and optimization.

11. The method as recited in claim 1 wherein said first EDA tool, said second EDA tool and said third EDA tool are each a different EDA tool.

12. A method of analyzing benefits to an integrated circuit associated with voltage scaling techniques, comprising:
obtaining measurements of voltage scaling metrics over a voltage range and a frequency range across an register transfer level through place and route portion of a design flow for said integrated circuit employing EDA tools;
normalizing said voltage scaling metric measurements over a designated implementation for said integrated circuit to obtain normalized benchmarks; and
assessing, by employing said normalized benchmarks, a metric profile of said integrated circuit offered by voltage scaling techniques, wherein said normalizing and said assessing are performed by a processor.

13. The method as recited in claim 12 wherein said designated implementation is at a designated worst-case corner from process-voltage-temperature corners associated with said integrated circuit.

14. The method as recited in claim 12 wherein said voltage scaling techniques include adaptive voltage scaling and optimization.

15. The method as recited in claim 12 wherein said normalized benchmarks include at least one metric selected from the group consisting of:
a performance metric,
a leakage power metric, and
a dynamic power metric.

16. The method as recited in claim 12 wherein said normalized benchmarks include at least one metric selected from the group consisting of:
a utilization metric, and
an area metric.

17. The method as recited in claim 12 wherein said assessing includes identifying zones of operation for using voltage scaling with said integrated circuit.

18. The method as recited in claim 12 wherein said assessing includes identifying expected performance gains associated with employing voltage scaling with said integrated circuit.

19. The method as recited in claim 12 wherein said assessing includes identifying a percentage of area reduction for said integrated circuit associated with employing one of said voltage scaling techniques.

20. An apparatus, comprising:
a metric determiner configured to obtain measurements over a voltage range and a frequency range of at least one voltage scaling metric associated with an integrated circuit across an register transfer level through a place and route portion of a design flow for said integrated circuit;
a metric normalizer configured to normalize said measurements; and
a metric assessor configured to analyze said measurements and generate ranges for benefits associated with employing voltage scaling with said integrated circuit.

* * * * *